(12) United States Patent
Pedigo

(10) Patent No.: US 6,840,425 B2
(45) Date of Patent: Jan. 11, 2005

(54) SCAVENGING SYSTEM

(75) Inventor: Jesse L. Pedigo, Chippewa Falls, WI (US)

(73) Assignee: TTM Advanced Circuits, Inc., Chippewa Falls, WI (US)

( * ) Notice: Subject to any disclaimer, the term of this patent is extended or adjusted under 35 U.S.C. 154(b) by 21 days.

(21) Appl. No.: 10/026,338

(22) Filed: Dec. 20, 2001

(65) Prior Publication Data

US 2002/0084305 A1 Jul. 4, 2002

Related U.S. Application Data

(63) Continuation-in-part of application No. 09/752,629, filed on Dec. 28, 2000, now Pat. No. 6,454,154.
(60) Provisional application No. 60/208,454, filed on May 31, 2000.

(51) Int. Cl.$^7$ ................................................. B23K 1/00
(52) U.S. Cl. ...................................................... 228/22
(58) Field of Search ........................... 228/22, 23, 212, 228/44.3, 44.7; 15/93.1

(56) References Cited

U.S. PATENT DOCUMENTS

| | | | |
|---|---|---|---|
| 3,601,523 A | 8/1971 | Arndt | 174/68.5 |
| 4,106,187 A | 8/1978 | Smith et al. | 29/625 |
| 4,283,243 A | 8/1981 | Andreades et al. | 156/237 |
| 4,360,570 A | 11/1982 | Andreades et al. | 428/596 |
| 4,622,239 A | 11/1986 | Schoenthaler et al. | 427/96 |
| 4,664,308 A * | 5/1987 | Boynton | 228/180.1 |
| 4,696,096 A * | 9/1987 | Green et al. | 29/829 |
| 4,700,474 A | 10/1987 | Choinski | 29/846 |
| 4,777,721 A | 10/1988 | Choinski | 29/846 |
| 4,783,247 A | 11/1988 | Seibel | 204/181.1 |
| 4,884,337 A | 12/1989 | Choinski | 29/846 |
| 4,945,313 A | 7/1990 | Brilka et al. | 329/349 |
| 4,964,948 A | 10/1990 | Reed | 156/659 |
| 4,995,941 A | 2/1991 | Nelson et al. | 156/630 |
| 5,053,921 A | 10/1991 | Nelson et al. | 361/386 |
| 5,058,265 A | 10/1991 | Goldfarb | 29/852 |
| 5,117,069 A | 5/1992 | Higgins et al. | 174/261 |
| 5,133,120 A | 7/1992 | Kawakami et al. | 29/852 |
| 5,145,691 A | 9/1992 | Kawakami et al. | 425/110 |
| 5,220,723 A | 6/1993 | Okada | 29/830 |
| 5,274,916 A | 1/1994 | Kawabata et al. | 29/848 |
| 5,277,854 A | 1/1994 | Hunt | 264/86 |
| 5,332,439 A | 7/1994 | Watanabe et al. | 118/213 |

(List continued on next page.)

FOREIGN PATENT DOCUMENTS

| | | |
|---|---|---|
| EP | 0 194 247 A2 | 9/1986 |
| EP | 0 713 358 A2 | 5/1996 |
| EP | 0 723 388 A1 | 7/1996 |

(List continued on next page.)

OTHER PUBLICATIONS

Via Etching Process, Feb. 1972.
Multilayer Printed Circuit Board Connections, Apr. 1996.
Process for Forming Copper Clad Vias, Aug. 1989.
Shoji Oikawa et al., Solder Coating Device, May 27, 1987, pages unknown.

Primary Examiner—Kiley S. Stoner
(74) Attorney, Agent, or Firm—Greenberg Traurig LLP

(57) ABSTRACT

A system comprising a scavenging blade, a printed wiring board receiving portion, and a movement mechanism adapted to move the scavenging blade and printed wiring board receiving portion relative to each other, and to a method of removing excess fill material comprising providing a printed wiring board having filled holes and at least some excess fill material on a surface of the printed wiring board, providing a system comprising a scavenging blade, positioning the printed wiring board in the system, and causing the scavenging blade to traverse at least a portion of the printed wiring board in a manner that causes the scavenging blade to remove at least a portion of the excess fill material from the printed wiring board.

11 Claims, 4 Drawing Sheets

U.S. PATENT DOCUMENTS

| | | | |
|---|---|---|---|
| 5,451,721 A | 9/1995 | Tsukada et al. | 174/261 |
| 5,456,004 A | 10/1995 | Swamy | 29/852 |
| 5,471,091 A | 11/1995 | Pasch et al. | 257/752 |
| 5,532,516 A | 7/1996 | Pasch et al. | 257/752 |
| 5,540,779 A | 7/1996 | Andris et al. | 118/692 |
| 5,578,151 A | 11/1996 | Andris et al. | 156/64 |
| 5,591,353 A | 1/1997 | Davignon et al. | 216/18 |
| 5,610,103 A | 3/1997 | Xu et al. | 437/225 |
| 5,637,834 A | 6/1997 | La Bate, Jr. et al. | 174/264 |
| 5,662,987 A | 9/1997 | Mizumoto et al. | 428/209 |
| 5,678,752 A * | 10/1997 | Kaminsky et al. | 228/223 |
| 5,699,613 A | 12/1997 | Chong et al. | 29/852 |
| 5,707,575 A | 1/1998 | Litt et al. | 264/104 |
| 5,744,285 A | 4/1998 | Felten et al. | 430/318 |
| 5,753,976 A | 5/1998 | Harvey | 257/774 |
| 5,761,803 A | 6/1998 | St. John et al. | 29/852 |
| 5,766,670 A | 6/1998 | Arldt et al. | 427/8 |
| 5,822,856 A | 10/1998 | Bhatt et al. | 29/832 |
| 5,824,155 A | 10/1998 | Ha et al. | 118/410 |
| 5,851,344 A | 12/1998 | Xu et al. | 156/379.6 |
| 5,906,042 A | 5/1999 | Lan et al. | 29/852 |
| 5,925,414 A | 7/1999 | Buechele et al. | 427/282 |
| 5,994,779 A | 11/1999 | Gardner et al. | 257/773 |
| 6,000,129 A | 12/1999 | Bhatt et al. | 29/852 |
| 6,009,620 A | 1/2000 | Bhatt et al. | 29/852 |
| 6,015,520 A | 1/2000 | Appelt et al. | 264/104 |
| 6,079,100 A | 6/2000 | Farquhar et al. | 29/852 |
| 6,090,474 A | 7/2000 | Johansson et al. | 428/209 |
| 6,106,891 A | 8/2000 | Kulesza et al. | 427/97 |
| 6,138,350 A | 10/2000 | Bhatt et al. | 29/852 |
| 6,149,857 A | 11/2000 | McArdle et al. | 264/429 |
| 6,153,508 A | 11/2000 | Harvey | 438/622 |
| 6,184,133 B1 | 2/2001 | Iijima et al. | 438/667 |
| 6,193,144 B1 * | 2/2001 | Yoshikawa et al. | 228/248.1 |
| 6,261,501 B1 | 7/2001 | Miyagawa et al. | 264/272.15 |
| 6,276,055 B1 | 8/2001 | Bryan et al. | 29/852 |
| 6,281,448 B1 | 8/2001 | Tsukamoto | 174/260 |
| 6,282,782 B1 | 9/2001 | Biunno et al. | 29/852 |
| 6,454,154 B1 * | 9/2002 | Pedigo | 228/33 |
| 6,491,204 B1 * | 12/2002 | Erdmann | 228/22 |
| 2002/0084305 A1 * | 7/2002 | Pedigo | |
| 2003/0037804 A1 * | 2/2003 | Erdmann | |

FOREIGN PATENT DOCUMENTS

| | | |
|---|---|---|
| FR | 2 684 836 | 3/1994 |
| FR | 2 714 567 | 1/1996 |
| GB | 2 120 017 A | 11/1983 |
| GB | 2 246 912 A | 2/1992 |
| GB | 2 341 347 A | 3/2000 |
| JP | 53-10487 | 9/1978 |
| JP | 54-139065 | 10/1979 |
| JP | 58011172 | 3/1983 |
| JP | 62-277794 | 12/1987 |
| JP | 62-287696 | 12/1987 |
| JP | 363295057 A * | 12/1988 |
| JP | 1173696 | 7/1989 |
| JP | 1236694 | 9/1989 |
| JP | 03004595 | 1/1991 |
| JP | 04186792 | 7/1992 |
| JP | 04239193 | 8/1992 |
| JP | 05275819 | 10/1993 |
| JP | 07176871 | 7/1995 |
| JP | 08172265 | 7/1996 |
| JP | 08191184 | 7/1996 |
| JP | 09083135 | 3/1997 |
| JP | 09321399 | 12/1997 |
| JP | 10065339 | 3/1998 |
| JP | 10256687 | 9/1998 |
| JP | 11054909 | 2/1999 |
| WO | WO 86/06243 | 10/1986 |
| WO | WO 00/13474 | 3/2000 |

* cited by examiner

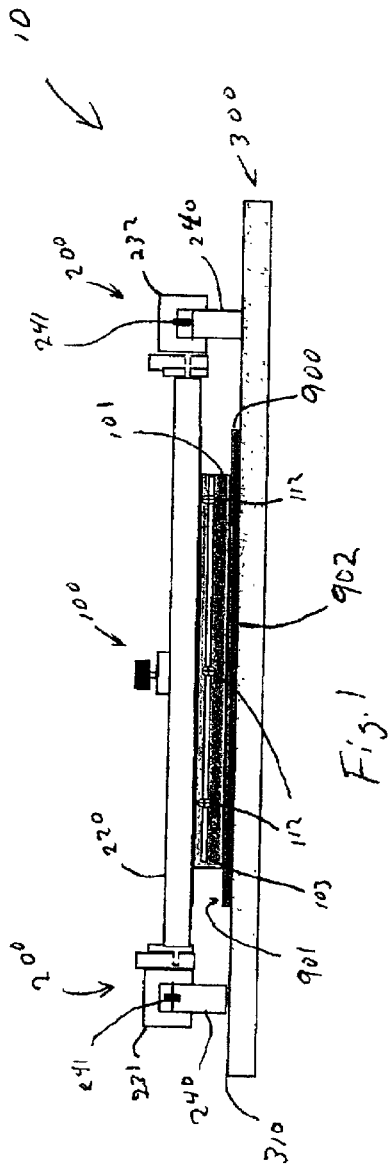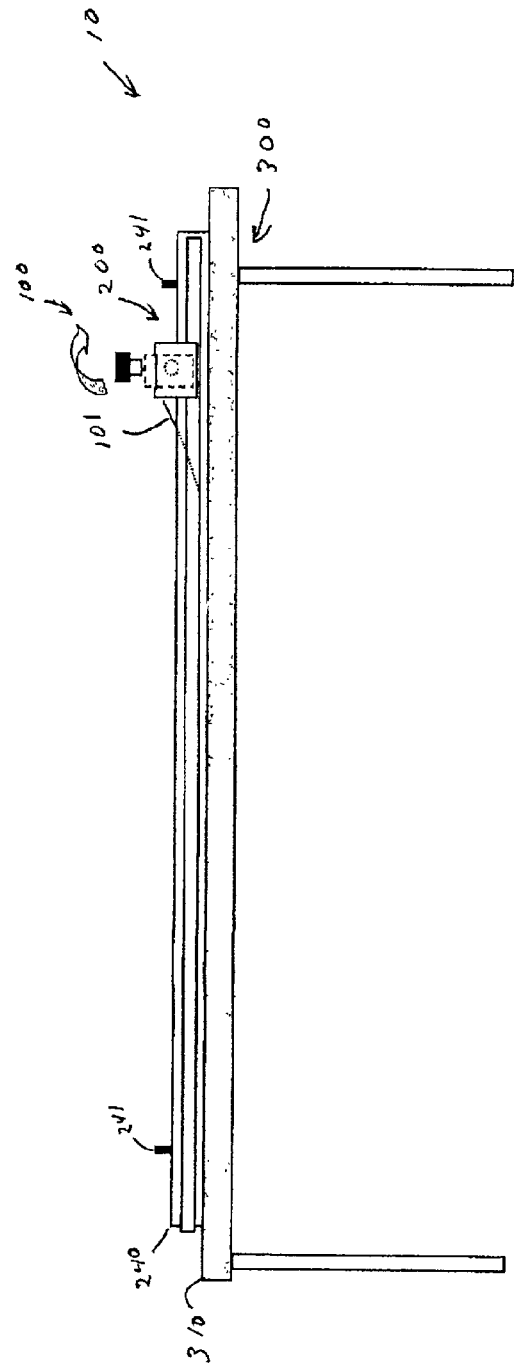

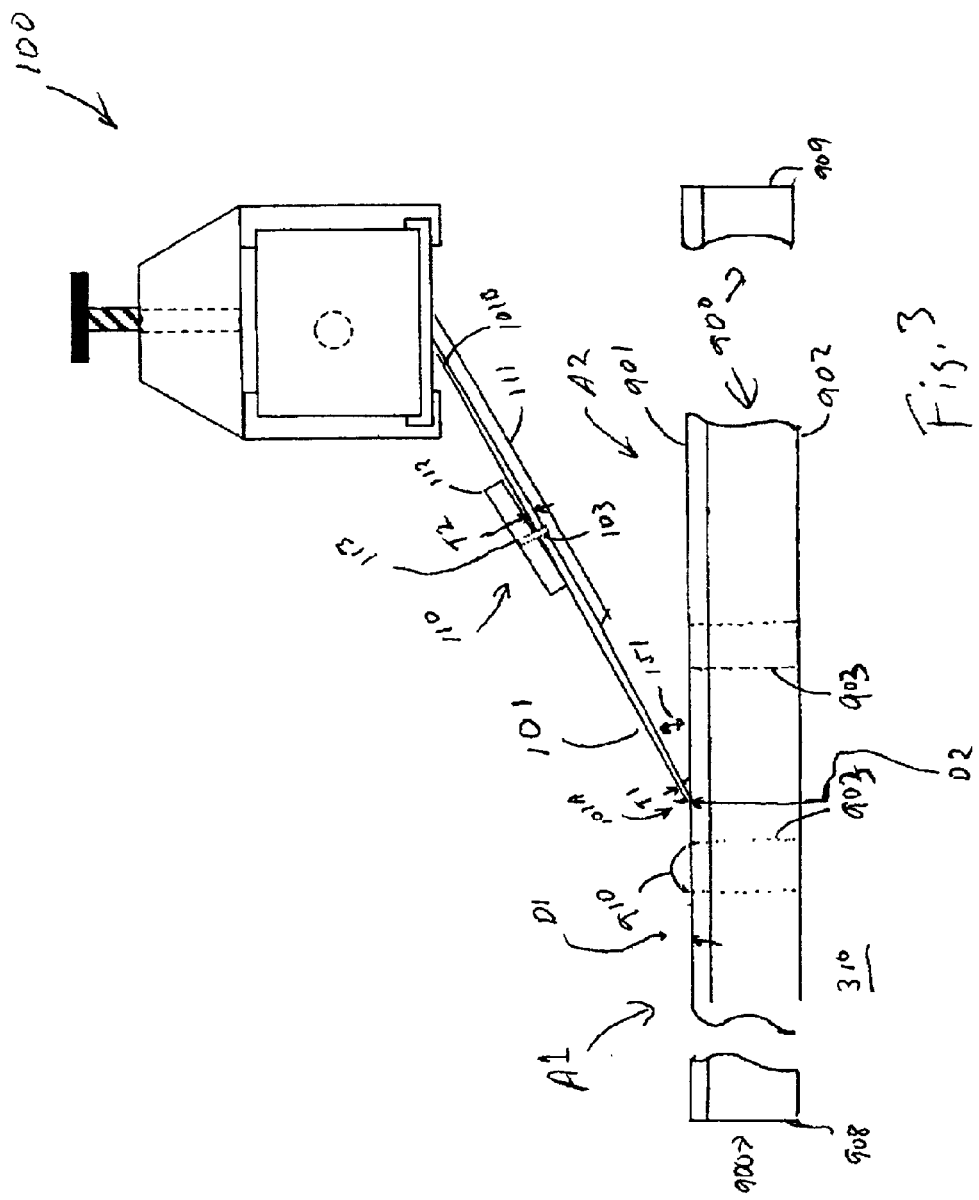

1010
providing a PWB having filled holes and at least some excess fill material on a surface of the PWB

1020
providing a system comprising a scavenging blade

1030
positioning the PWB in the system

1040
causing the scavenging blade to traverse at least a portion of the PWB in a manner that causes the scavenging blade to remove at least a portion of the excess fill material from the PWB

Fig. 6

SCAVENGING SYSTEM

This is a continuation-in-part of U.S. application Ser. No. 09/752,629, filed Dec. 28, 2000, which claims the benefit of U.S. Provisional Application No. 60/208,454, filed May 31, 2000, now U.S. Pat. No. 6,454,154. A related application having a similar title and the same inventors as this application is being filed concurrently. All of the foregoing applications are herein incorporated by reference in their entireties.

FIELD OF THE INVENTION

The field of the invention is substrate via filling and material recovery.

BACKGROUND OF THE INVENTION

A common structure in various electronics packages, such as laminate packages, wired circuit boards, ceramic substrates, and hybrid circuits, is a via or hole. A via or hole is a vertical opening which can be filled with conducting material used to connect circuits on various layers of a substrate or electronics packages to one another. A hole generally starts as an empty cylindrical opening in an electronics package that is formed by drilling. The hole is then plated with an electrical conductor such as copper or tin. Plating of the hole provides the primary electrical contact at the various layers within the device. After plating, the hole is typically filled with an electrically conductive, thermally conductive or nonconductive paste. Among other reasons, holes are filled after plating to providing a secondary or fail safe electrical connection, to provide structure integrity, to prevent chemical process entrapment from down-line operations, and/or to provide thermal conductivity to remove heat from the inner circuit layers of the resulting device.

A common method for filling holes is to use a squeegee blade to force material into the holes. Squeegee blade application consists of using a metal, polymer, or composite blade to force hole fill material through the holes, using a roll-effect pumping action caused by the squeegee being moved forward at a given angle to that of the substrate under process. This process can lead to divot or material drag-out caused by the trailing edge of the squeegee, leading to poor leveling.

An alternative method of hole filling is to use a print/pressure head and pressurized fill material to fill holes. The use of a print head may involve sealing the print head against a substrate and forcing fill material through the print head and into holes of the substrate located within the area of the substrate sealed by the print head. Such methods and devices are discussed in U.S. patent application Ser. Nos. 09/752,629 and 09/752,503, each of which is incorporated herein by reference in its entirety.

The hole fill process often leaves excess paste material on the printed panel surface. This is especially true for non-uniform printed circuit/wiring boards/panels. The excess material, if cured as processed, can create extensive problems for subsequent planarization that is required to provide a uniform plating, or capping step. The more layers involved in a PCB/PWB, the more non-uniform the surface tends to be. In order to be cost-effective, the number of passes required to level the cured, hole filled panel, must be kept to a minimum. When the minimum number of leveling passes is exceeded, there is often damage to the underlying copper/circuitry, and the panel must be scrapped.

SUMMARY OF THE INVENTION

The present invention is directed to a system comprising a scavenging blade, a printed wiring board receiving portion, and a movement mechanism adapted to move the scavenging blade and printed wiring board receiving portion relative to each other, and to a method of removing excess fill material comprising providing a printed wiring board having filled holes and at least some excess fill material on a surface of the printed wiring board, providing a system comprising a scavenging blade, positioning the printed wiring board in the system, and causing the scavenging blade to traverse at least a portion of the printed wiring board in a manner that causes the scavenging blade to remove at least a portion of the excess fill material from the printed wiring board.

Various objects, features, aspects and advantages of the present invention will become more apparent from the following detailed description of preferred embodiments of the invention, along with the accompanying drawings in which like numerals represent like components.

BRIEF DESCRIPTION OF THE DRAWINGS

FIG. 1 is a front view of a scavenging system of the present invention.

FIG. 2 is a side view of the system of FIG. 1.

FIG. 3 is a detail view of the blade assembly and PWB of FIGS. 1 and 2.

FIG. 6 is a view of a method of using the system of FIG. 1.

DETAILED DESCRIPTION

Figure 4:
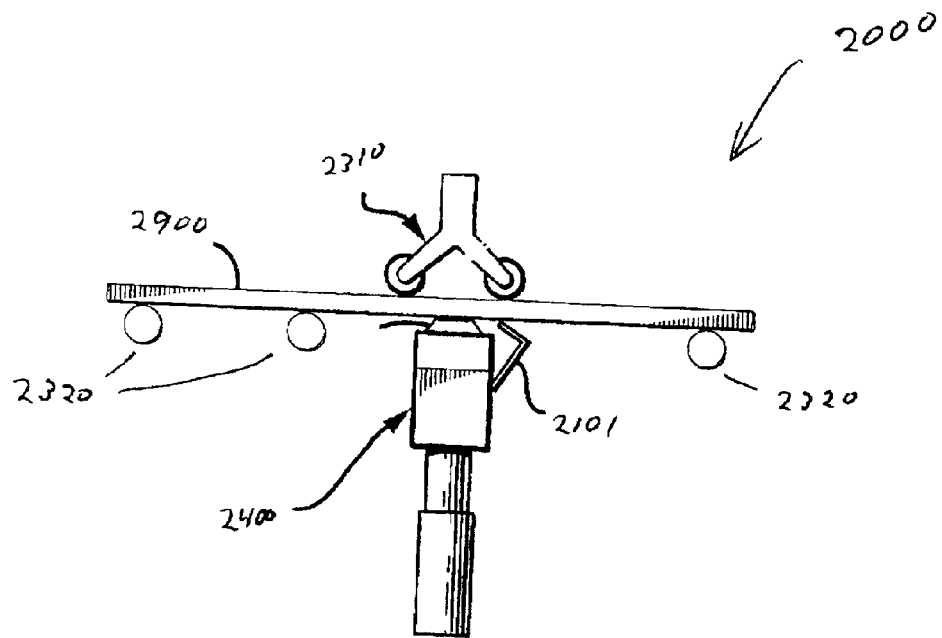
FIG. 4 is a side view of a second scavenging system of the present invention.

Referring first to FIGS. 1, 2, and 3, system 10 comprises scavenging blade assembly 100, movement mechanism 200, support assembly 300, and printed wiring board (PWB) 900. Scavenging blade assembly 100 and PWB 900 move relative to each other while scavenging blade 101 of scavenging blade assembly 100 is substantially parallel to a surface 901 of PWB 900, and either in contact with or just adjacent to PWB 900. Blade 101 and surface 901 may, in some instances, be separated at least partially by a stencil. In other instances, surface 901 of PWB 900 may comprise a resist layer. Although either one or both of PWB 900 and scavenging blade assembly 100 may be moveable, the net effect of the movement is that scavenging blade 101 traverses substantially all of surface 901, and in so doing removes excess fill material 910 from surface 901, particularly from the ends of holes 903 passing through PWB 900 between surfaces 901 and 902.

Scavenging blade 101 is preferably polished and flexible and formed from spring steel to allow uniform scavenging of excess fill material from surface 901. Scavenging blade 101 preferably comprises sharpened edge 101A having a thickness T1 less than or equal to 0.003 inches, and varying in thickness from the thickness of edge 101A to a thickness T2 of approximately 0.01 inches. It is contemplated that blade 101 may be advantageously formed as a rectangle with two sharpened edges such that reversing the blade 101 results in edge 101A being replaced with edge 101B, and that blade 101 be formed with a slot 103 to allow blade 01 to be clamped to the rest of blade assembly 100 by way of clamping assembly 110.

It should be noted that blade 101 is positioned so that its leading edge 101A is closest to PWB 900 and is "pushed" along PWB 900 whereas a squeegee used in prior art hole filling operations is typically "pulled" long PWB 900 with the portion of the squeegee closest to PWB 900 being a trailing edge.

The blade 101 is preferably mounted to blade assembly 100 by way of clamping assembly 110 in a manner that causes minimal, if any, buckling/bending of blade 101. Clamping assembly 110 preferably comprises blade anchor/support 111, blade retention member/thumb screw 112, and threaded post 113. In the embodiment of FIG. 3, blade support 111 determines the angle 151 between blade 101 and surface 901, and also provide a flat support surface to which blade 101 is clamped to minimize buckling/bending of blade 101.

The blade assembly 100 is preferred to be mounted to movement mechanism 200 by way of cross-rail support 220 in a manner that permits blade 101 to be pivoted down towards the surface 901 to be scavenged, and back up to a material recovery position. While pivoted down blade 101 is moved along surface 101 for scavenging. After scavenging blade 101 is pivoted up to allow recovery of scavenged material, and paste removal from blade 101. The blade 101, clamp 210, and cross-member 220 are mounted on bearing blocks 231 and 232 that travel on parallel rails 240 allowing the blade 101 to traverse the entire distance of the PWB 900, and then to pivot/lift away from PWB 900 and be positioned on a resting block designed to allow rapid clearing of paste material 910 into a paste recovery vessel. Movement mechanism may also comprise stops 241 which prevent movement of bearing blocks 231 and 232 off of the ends of rails 240.

The speed at which blade 101 traverses surface 901, and the angle 151 between blade 101 and surface 901 are both pre-determined based on the rheology of the fill material 910 to be removed from surface 901. The angle, material type, and flexibility of the blade 101 allows for a "knifing" or shearing of the fill material 910 at the top of the holes 903, and follows topography to the extent of removing enough material for acceptable, and uniform planarization, without causing dish-down, or deformity of the hole top surfaces.

Cross rail support 220 is preferably mounted to support assembly 300 comprising supporting surface 310. Supporting surface 310 acts as a PWB receiving member to provide support to PWB 900 during scavenging and may also directly support rails 240 of movement mechanism 200. Support assembly 300 may be configured as a table with supporting surface 310 being the tabletop.

It should be noted that, during scavenging, scavenging blade 101 is positioned adjacent to surface 901 and between ends 908 and 909 of PWB 900. While in such a position, blade 101 divides surface 901 into a first area A1 and a second area A2, wherein area A1 comprises at least one hole 903 containing fill material 910 extending outward from the printed wiring board for a distance D1 substantially greater than the distance D2 separating the scavenging blade 101 from surface 901 of PWB 900, and area A2 comprises a plurality of holes 903 containing fill material 910, none of which have fill material 910 extending outward from the printed wiring board for a distance substantially greater than the distance separating the scavenging blade from the PWB 900.

System 10 may also comprise a filling mechanism such as a squeegee or a pressure head. In such an embodiment, blade 101 may be coupled to the filling mechanism such that the filling mechanism and blade 101 move together. Alternatively, blade 101 may be moveable independent of any such filling mechanism.

Referring to FIG. 4, an alternative PWB processing system 2000 comprises a scavenging blade 2101 coupled to a filling mechanism 2400, a printed wiring board receiving portion comprising roller member 2310 and rollers 2320 which also function as a movement mechanism adapted to move the scavenging blade and printed wiring board receiving portion relative to each other. Coupling scavenging blade 210 to filling mechanism 2400 causes scavenging blade 2101 to move (or not as is the case in the system shown) along with filling mechanism 2400.

Figure 5:
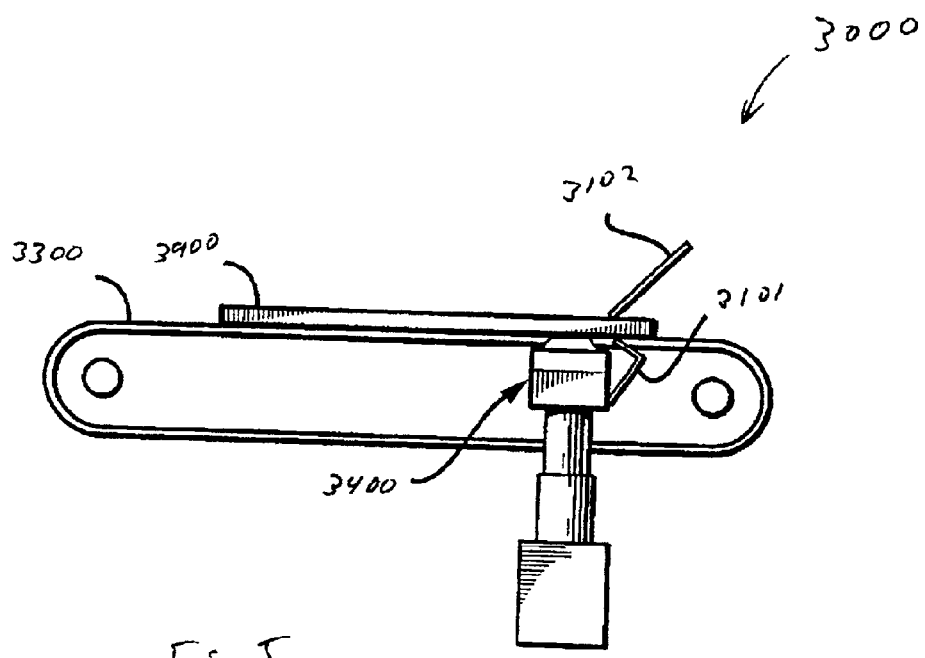
FIG. 5 is a side view of a third scavenging system of the present invention.

Referring to FIG. 5, another alternative PWB processing system 3000 comprises scavenging blades 3101 and 3102, PWB 3900, and PWB receiving portion and movement mechanisms 3300.

Referring to FIG. 6, a method of using system 10 to remove excess fill material comprises: (a) step 1010, providing a PWB 900 having filled holes and at least some excess fill material 910 on a surface 901 of the PWB 900; (b) step 1020, providing a system 10 comprising a scavenging blade 101; (c) step 1030, positioning the PWB 900 in the system 10; and (d) step 1040, causing the scavenging blade 101 to traverse at least a portion of the PWB 900 in a manner that causes the scavenging blade 101 to remove at least a portion of the excess fill material 910 from the PWB 900. Removal of excess fill material, as previously discussed, results from the blade 101 shearing the excess material off from PWB 900.

Scavenging the excess fill material may include first pivoting the blade 101 closer to the PWB 900 as an initial step, and pivoting the blade 101 away from PWB 900 once traversal of PWB 900 by blade 101 is complete. It may also include moving scavenged fill material from blade 101 to a paste recovery vessel. Causing the scavenging blade 101 to traverse at least a portion of the PWB 900 may include moving the scavenging blade 101 while the PWB 900 is stationary, moving the PWB 900 while the scavenging blade 101 is stationary, or moving both the PWB 900 and the scavenging blade 101.

Thus, specific embodiments and applications of fill material scavenging systems have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A system comprising:

a scavenging blade;

a printed wiring board receiving portion; and a movement mechanism adapted to move the scavenging blade and printed wiring board receiving portion relative to each other wherein:

the system is adapted to remove fill material which accumulates on the blade during the relative movement of the scavenging bladed and printed wiring board;

the system comprises a printed wiring board positioned on the printed wiring board receiving portion, the printed wiring board having both first and second substantially planar surfaces that are substantially parallel to each other and at least one filled hole extending from the first surface to the second surface; and the scavenging blade is positioned adjacent to the first surface, between a first end and a second end of the printed wiring board, and divides the first surface into a first area and second area, wherein the first action comprises at least one hole containing fill material extending outward from the printed wiring board for a distance substantially greater than the distance separating the scavenging blade from the printed wiring board, and the second area comprises a plurality of holes containing fill material, none of which have fill material extending outward from the printed wiring board for a distance substantially greater than the distance separating the scavenging blade from the printed wiring board.

2. The system of claim 1 further comprising a filling mechanism wherein the scavenging blade is not part the filling mechanism.

3. The system of claim 2 wherein the scavenging blade moves independently from the filling mechanism.

4. The system of claim 2 wherein the scavenging blade is coupled to the filling mechanism.

5. The system of claim 2 wherein the filling mechanism is a squeegee or pressure head.

6. A system comprising:
   a scavenging blade;
   a printed wiring board receiving portion; and
   a movement mechanism adapted to move the scavenging bladed and printed wiring board receiving portion relative to each other;
   wherein the scavenging blade is polished, flexible, and sharpened along at least one edge such that it has a width less than or equal to approximately 0.003 inches.

7. The system of claim 6 wherein the system further comprises:
   two guided rails extending along opposite sides of the receiving portion;
   a crossbar coupled to two bearing blocks with one of the two bearing blocks being slideably coupled one of the two guide rails and, the other of the two bearing blocks being slideably coupled to the other guide rail and;
   a clamping device clamping the scavenging bladed to the crossbar.

8. The system of claim 7 wherein the blades is pivotably coupled to the two guide rails.

9. A system to remove excess fill material comprising:
   a scavenging blade adapted to shear oft fill material and promote uniform plananzation by at least partially avoiding fill material dish-down into any fill holes caused by removal of excess fill material;
   a printed wiring board receiving portion;
   a movement mechanism adapted to move the scavenging blade and printed wiring board receiving portion relative to each other; and
   wherein the scavenging blade is positioned to move between a printed wiring board positioned in the receiving portion and at least some excess fill material on the printed wiring.

10. The system of claim 9 wherein the system is adapted to push a leading edge of the scavenging blade along a surface of printed wiring board to remove excess fill material from the printed wiring board.

11. The system of claim 10 wherein pushing the leading edge of the blade results from moving the printed wiring board relative to the blade.

* * * * *